(12) United States Patent
Bloomquist et al.

(10) Patent No.: US 6,646,910 B2
(45) Date of Patent: Nov. 11, 2003

(54) MAGNETIC MEMORY USING REVERSE MAGNETIC FIELD TO IMPROVE HALF-SELECT MARGIN

(75) Inventors: Darrel R. Bloomquist, Meridian, CA (US); Manoj K. Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/090,246

(22) Filed: Mar. 4, 2002

(65) Prior Publication Data

US 2003/0174537 A1 Sep. 18, 2003

(51) Int. Cl.[7] .................. G11C 11/00; G11C 11/114
(52) U.S. Cl. .................. 365/158; 365/171; 365/173
(58) Field of Search .......................... 365/158, 171, 365/173

(56) References Cited

U.S. PATENT DOCUMENTS

| | | | | |
|---|---|---|---|---|
| 6,034,887 A | * | 3/2000 | Gupta et al. ................. | 365/171 |
| 6,097,626 A | | 8/2000 | Brug et al. | |
| 6,134,139 A | | 10/2000 | Bhattacharyya et al. | |
| 6,490,217 B1 | * | 12/2002 | DeBrosse et al. ......... | 365/225.5 |

* cited by examiner

Primary Examiner—Son Mai

(57) ABSTRACT

A magnetic memory includes a circuit configured to apply a reverse magnetic field to one or more half-selected magnetic memory cells to improve half-select margin in the magnetic memory.

10 Claims, 7 Drawing Sheets

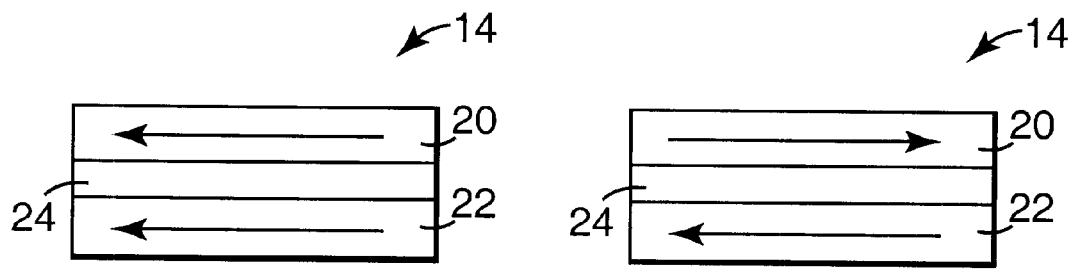
Fig. 2a    Fig. 2b
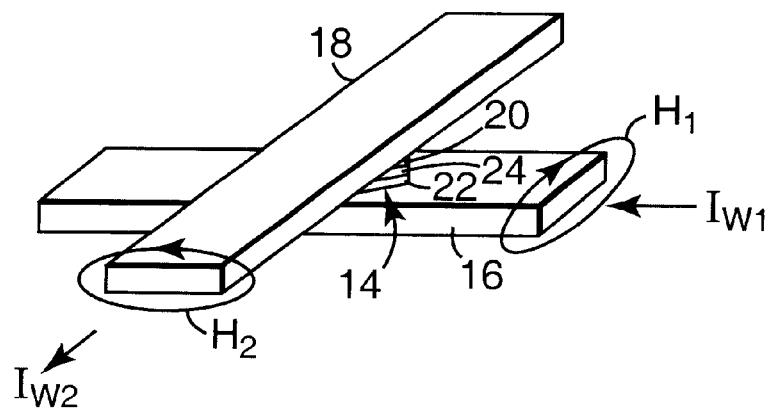
Fig. 3

MAGNETIC MEMORY USING REVERSE MAGNETIC FIELD TO IMPROVE HALF-SELECT MARGIN

THE FIELD OF THE INVENTION

The present invention generally relates to the field of magnetic memories. More particularly, the present invention relates to a magnetic memory device and method which provide improved half-select margins.

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations, parallel and anti-parallel with respect to the reference layer, represent, for example, logic values of "0" and "1."

Typically, the orientation of magnetization in the data storage layer aligns along an axis of the data storage layer that is commonly referred to as its easy axis. The external magnetic fields are applied to flip the orientation of magnetization in the data storage layer along its easy axis to either a parallel or anti-parallel orientation. With parallel orientation, the magnetic memory cell is in a low resistance state, and with anti-parallel orientation, the magnetic memory cell is in a high resistance state. These parallel and anti-parallel resistance states are due to unequal quantum mechanical tunneling of spin polarized electrons between the pinned layer and the data layer.

One type of MRAM device includes an array of magnetic memory cells. Word lines extend along rows of the magnetic memory cells, and bit lines extend along columns of the magnetic memory cells. Each magnetic memory cell is located at an intersection of a word line and a bit line. A selected magnetic memory cell is usually written by applying electrical currents to the particular word and bit lines that intersect at the selected magnetic memory cell. The electrical current applied to the particular word line generates a magnetic field having a component along the easy axis of the selected magnetic memory cell. This magnetic field may be referred to as a word line write field. An electrical current applied to the particular bit line also generates a magnetic field having a component along the easy axis of the selected magnetic memory cell. This magnetic field may be referred to as a bit line write field.

The selected magnetic memory cell receives both the word line and bit line write fields. Other magnetic memory cells coupled to the particular word line usually receive only the word line write field. Other magnetic memory cells coupled to the particular bit line usually receive only the bit line write field. A magnetic memory cell receiving only the word line or the bit line write field is termed a "half-selected" magnetic memory cell. The magnitudes of the word line and bit line write fields are usually chosen to be high enough so that the selected magnetic memory cell switches its logic state but not too high so that the half-selected magnetic memory cells which are subject to either the word line or the bit line write field switch their logic states. This difference in magnitudes is called the half-select margin. An undesirable switching of the state of a magnetic memory cell that receives only the word line or only the bit line write field is commonly referred to as half-select switching.

Manufacturing variation in the dimensions or shapes of the magnetic memory cells can increase the likelihood of half-select switching due to insufficient half-select margins. Variations in the thickness or in the crystalline anisotropy of the data storage layers can also increase the likelihood of half-select switching. Furthermore, reductions in the magnetic memory cell size can also increase the likelihood of half-select switching. As a result, magnetic memory manufacturing yield and reliability is correspondingly decreased.

It is a continuing goal of the industry to improve manufacturing yields and reliability in order to reduce the cost and size of magnetic memories. Consequently, approaches which suppress the inadvertent switching of half-selected memory cells are desired.

SUMMARY OF THE INVENTION

The present invention is a magnetic memory which includes a circuit configured to apply a reverse magnetic field to one or more half-selected magnetic memory cells to improve half-select margin in the magnetic memory.

BRIEF DESCRIPTION OF THE DRAWINGS

FIGS. 2a and 2b are diagrams illustrating parallel and anti-parallel magnetization of a magnetic memory cell.

FIG. 3 is a diagram illustrating a magnetic memory cell that has been selected during a write operation.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
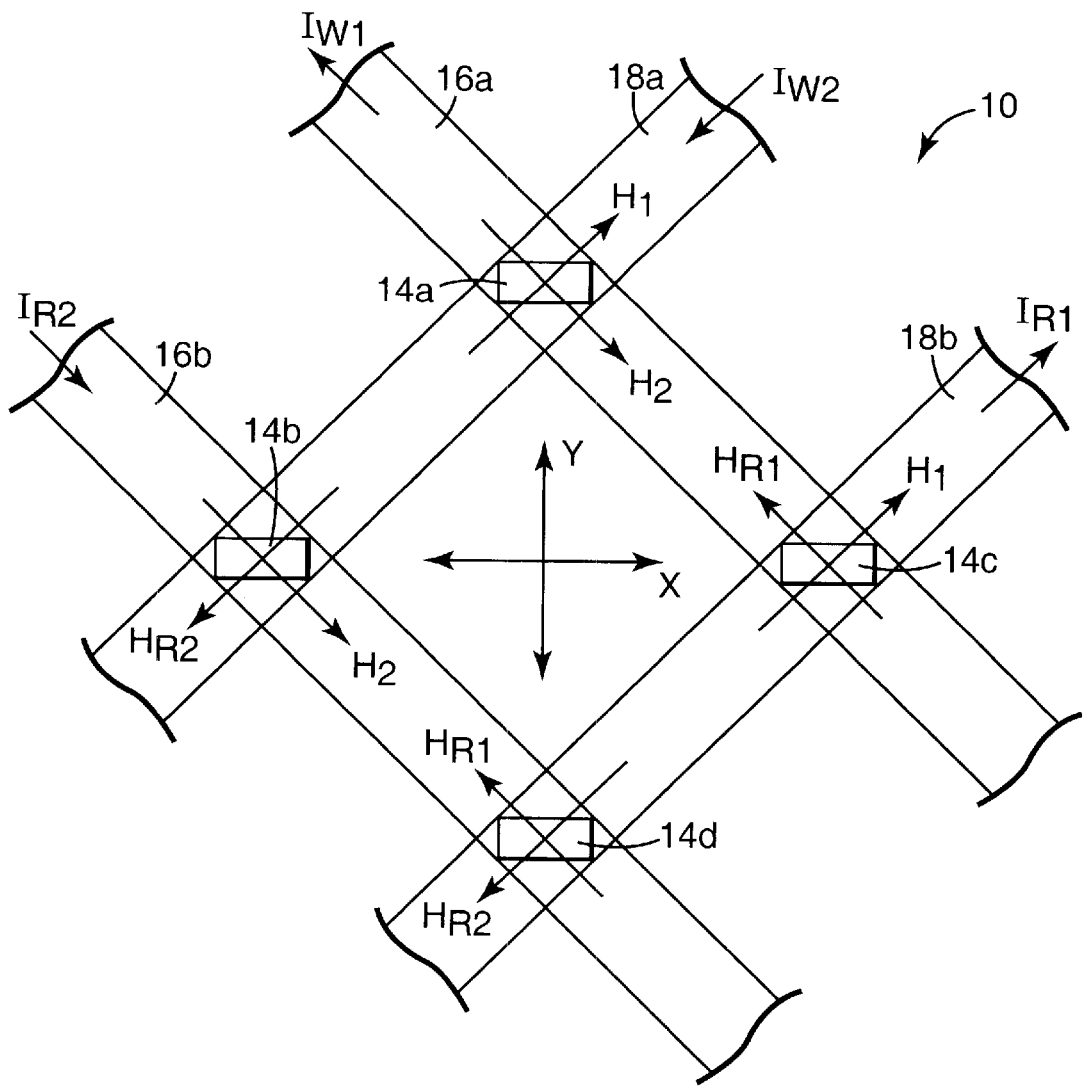
FIG. 1 is a diagram illustrating one exemplary embodiment of a magnetic memory according to the present invention.

FIG. 1 is a diagram illustrating one exemplary embodiment of a magnetic memory according to the present invention. In magnetic memory 10, a reverse magnetic field is applied to one or more half-selected magnetic memory cells to improve the half-select margin in magnetic memory 10. The magnetic memory 10 includes an array of magnetic memory cells 14. The magnetic memory 10 also includes an array of conductors 16 and 18 which enable read and write access to magnetic memory cells 14. In one embodiment, conductors 16 are formed to be substantially orthogonal to conductors 18. In other embodiments, conductors 16 are not substantially orthogonal to conductors 18.

In the embodiment illustrated in FIG. 1, a set of x-y axes is used to describe the relative orientation of conductors 16 and 18 and their respective magnetic fields to magnetic memory cells 14 during write operations. The x axis is substantially parallel to the easy axes of the data storage layers of magnetic memory cells 14. The y axis is substantially perpendicular to the easy axes of the data storage layers of magnetic memory cells 14. These geometries can be formed using known magnetic film process techniques including photolithography, masking, and etching.

In the embodiment illustrated in FIG. 1, the logic states of magnetic memory cells 14 are manipulated by applying electrical currents to conductors 16 and 18. In one embodiment, conductors 16 and 18 form an array of word and bit lines which cross magnetic memory cells 14, wherein each magnetic memory cell is intersected by a word line and a bit line. In one embodiment, conductors 16 are bit lines and conductors 18 are word lines. In another embodiment, conductors 18 are word lines and conductors 16 are bit lines.

In the embodiment illustrated in FIG. 1, magnetic memory cell 14a is written by supplying a first write current to conductor 16a and a second write current to conductor 18a, each of which intersects magnetic memory cell 14a. The electrical current supplied to conductor 16a in one direction creates a first magnetic field ($H_1$) in magnetic memory cell 14a according to the right-hand rule. This electrical current in conductor 16a also creates the $H_1$ field in magnetic memory cell 14c. Similarly, electrical current supplied to conductor 18a in one direction creates a second magnetic field ($H_2$) in magnetic memory cell 14a according to the right-hand rule. This electrical current in conductor 18a also creates the $H_2$ field in magnetic memory cell 14b. Magnetic memory cells 14b and 14c are referred to as half-selected magnetic memory cells because they each only see one of either the $H_1$ magnetic field or the $H_2$ magnetic field: Only magnetic memory cell 14a sees both the $H_1$ magnetic field and the $H_2$ magnetic field.

In the exemplary embodiment illustrated in FIG. 1, a reverse current $I_{R1}$ is supplied to conductor 18b which intersects or crosses half-selected magnetic memory cell 14c. The reverse current $I_{R1}$ supplied to conductor 18b causes a reverse magnetic field $H_{R1}$ in magnetic memory cell 14c according to the right-hand rule which improves the half-select margin for magnetic memory cell 14c (see also, FIG. 5). In the exemplary embodiment illustrated in FIG. 1, a reverse current $I_{R2}$ is supplied to conductor 16b which intersects or crosses half-selected magnetic memory cell 14b. The reverse current $I_{R2}$ supplied to conductor 16b causes a reverse magnetic field $H_{R2}$ in magnetic memory cell 14b according to the right-hand rule which improves the half-select margin for magnetic memory cell 14b (see also, FIG. 6). The reverse current $I_{R1}$ supplied to conductor 18b and the reverse current $I_{R2}$ supplied to conductor 16b causes the reverse magnetic fields $H_{R1}$ and $H_{R2}$ in magnetic memory cell 14d. In one embodiment, the reverse current $I_{R1}$ has a magnitude which is less than the magnitude of write current $I_{w2}$, and the reverse current $I_{R2}$ has a magnitude which is less than the magnitude of write current $I_{w1}$, so that magnetic memory cell 14d is not selected by reverse currents $I_{R1}$ and $I_{R2}$.

In one embodiment, the preselected angle of orientation of conductors 16 and 18 is nonparallel with respect to the easy axes of the data storage layers in magnetic memory cells 14 so that the magnetic field components of $H_1$ and $H_2$ can combine along the easy axis.

FIGS. 2a and 2b are diagrams illustrating parallel and anti-parallel magnetization of a magnetic memory cell. The magnetic memory cells 14 are not limited to any particular type of device. In one embodiment, magnetic memory cells 14 are spin tunneling devices. In alternative embodiments, other types of magnetic memory cells are formed which include, but are not limited to, anisotropic magnetoresistance devices, giant magnetoresistance devices or colossal magnetoresistance devices.

In one embodiment, magnetic memory cells 14 are spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 2a illustrates by arrows a "parallel" orientation when the magnetization of the free and pinned layers 20 and 22 are in the same direction. FIG. 2b illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 2a. The resistance of magnetic memory cell 14 is increased to a second value R+ΔR when the orientation of magnetization is changed from parallel to anti-parallel as illustrated in FIG. 2b.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

In one embodiment, the logic value stored in magnetic memory cell 14 is read by sensing the resistance of magnetic memory cell 14. A voltage is applied across the conductors 16 and 18 which cross magnetic memory cell 14. The resulting current can be measured to determine whether magnetic memory cell 14 has the resistance of value R corresponding to one logic value, or the resistance value of R+ΔR corresponding to the other logic value.

FIG. 3 is a diagram illustrating a magnetic memory cell that has been selected during a write operation. In one embodiment, the magnetization in free layer 20 of selected magnetic memory cell 14 is oriented by supplying the currents $I_{W1}$ and $I_{W2}$ to conductors 16 and 18 crossing magnetic memory cell 14. In one embodiment, the easy axis of memory cell 14 is substantially parallel to the x axis as illustrated in FIG. 1. Supplying current $I_{W1}$ to conductor 16 causes a magnetic field $H_1$ to form around conductor 16. Supplying current $I_{W2}$ to conductor 18 causes a magnetic field $H_2$ to form around conductor 18. When a sufficiently large current is passed through both conductors 16 and 18, magnetic fields $H_1$ and $H_2$ in the vicinity of free layer 20 combine along the easy axis of magnetic memory 14 to rotate the parallel orientation to the anti-parallel orientation, or to rotate the anti-parallel orientation to the parallel orientation, thus switching the cell between logic states. Additional magnetic memory cells along conductor 16 which are exposed to the magnetic field $H_1$ and additional magnetic memory cells along conductor 18 which are exposed to magnetic field $H_2$ are termed half-selected magnetic memory cells.

Figure 4:
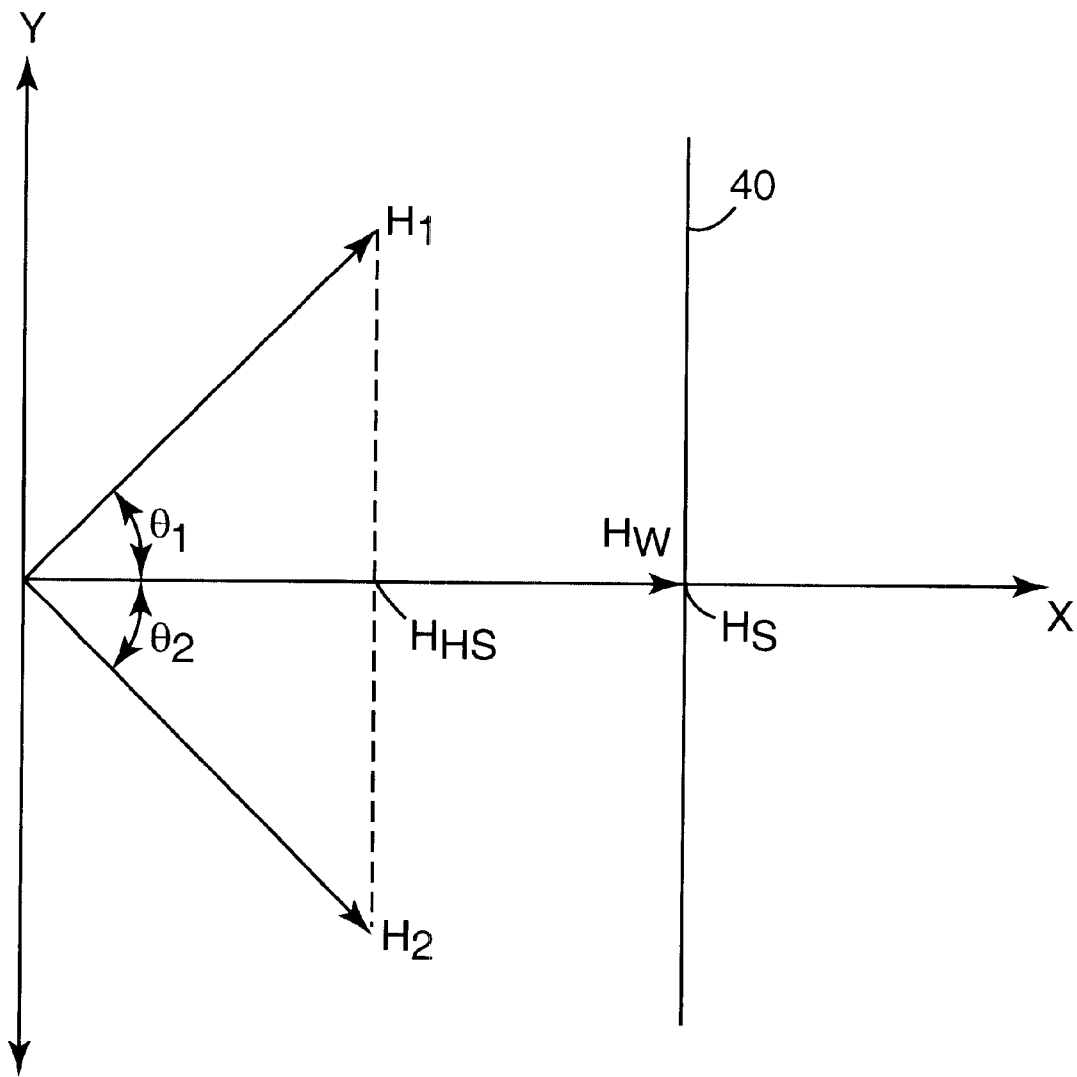
FIG. 4 illustrates the relationship between the $H_1$ and $H_2$ fields and the switching characteristics of the data storage layer of a magnetic memory cell.
Figure 5:
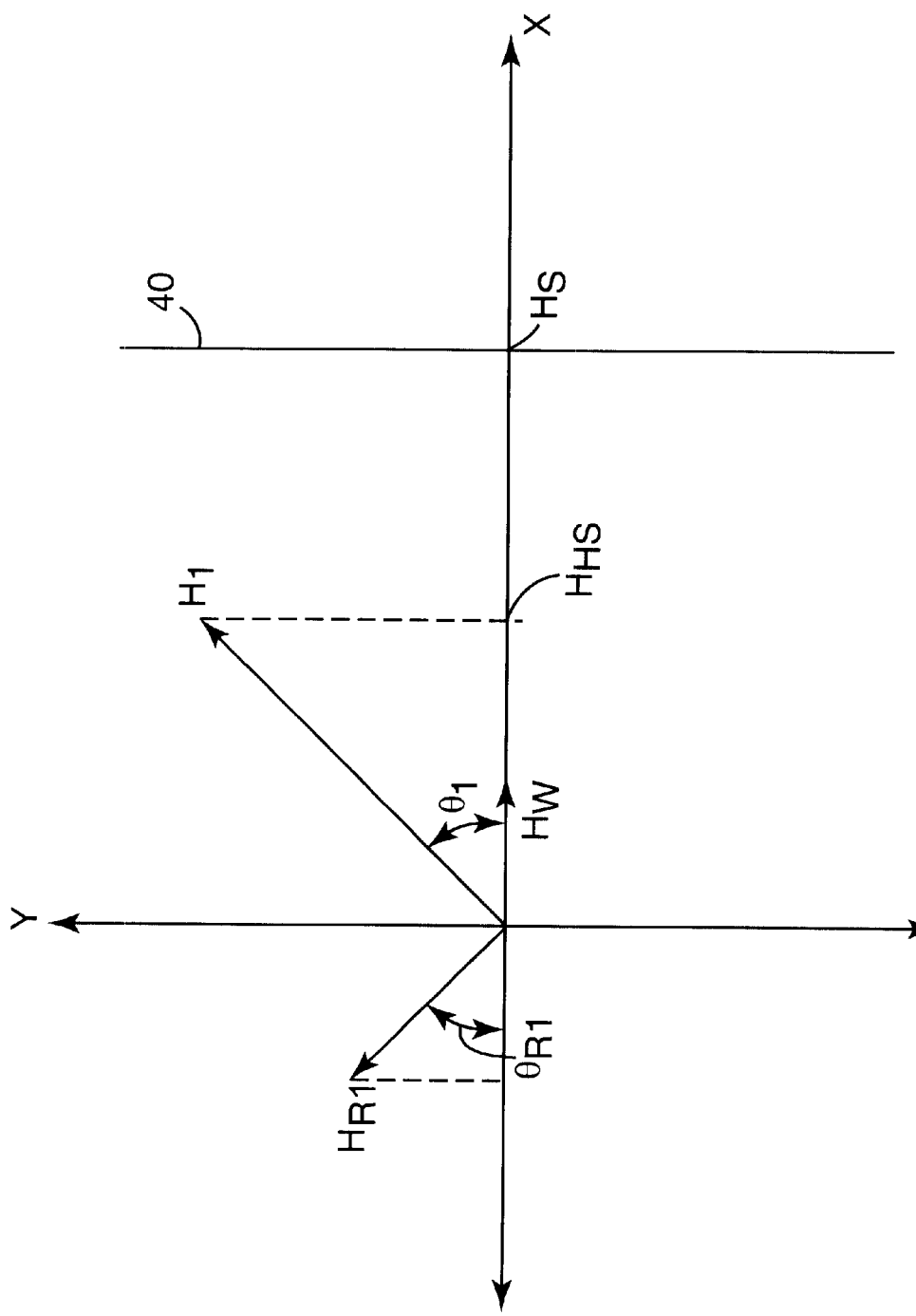
FIG. 5 illustrates the relationship between the $H_1$ field and the reverse field $H_{R1}$ of the data storage layer of a half-selected magnetic memory cell.
Figure 6:
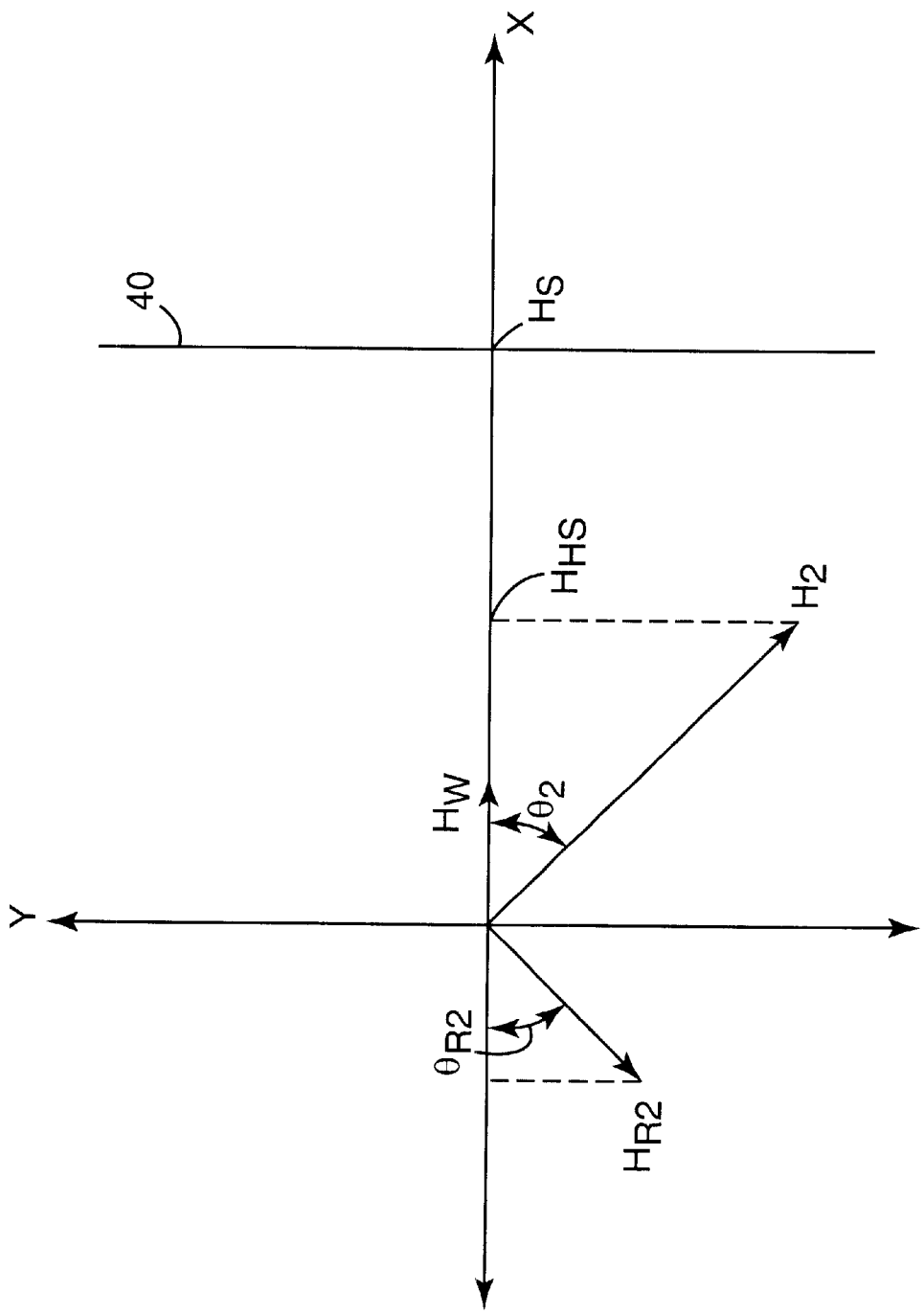
FIG. 6 illustrates the relationship between the $H_2$ field and the reverse field $H_{R2}$ of the data storage layer of a half-selected magnetic memory cell.

FIG. 4 illustrates the relationship between the $H_1$ and $H_2$ fields and the switching characteristics of data storage layer 20 of a magnetic memory cell. FIGS. 4–6 use the same x-y axis reference as FIG. 1. In the embodiment illustrated in FIG. 4, the preselected angle of orientation of conductors 16 and 18 with respect to the x axis or easy axis is 45°. In alternative embodiments, the preselected angle of orientation of conductors 16 and 18 is nonparallel with respect to the easy axis. Vector $H_1$ forms a 45° angle with respect to the x axis indicated at $\theta_1$. Similarly, vector $H_2$ forms a 45° angle with respect to the x axis indicated at $\theta_2$. In alternative embodiments, $\theta_1$ and $\theta_2$ are any angle other than a 90° angle with respect to the easy axis when the preselected angle of orientation of conductors 16 and 18 is nonparallel with respect to the easy axis.

A line 40 represents a theoretical switching characteristic for data storage layer 20 of magnetic memory cell 14. The line 40 illustrates that a magnetic field having a minimum magnitude equal to $H_s$ is needed to flip the orientation of magnetization in the data storage layer of magnetic memory cell 14 between the −x and the +x directions.

The magnitudes of the $H_1$ and $H_2$ fields are preselected so that the resulting field $H_W$ has a magnitude that is greater than or equal to the magnitude $H_s$ needed to write the magnetic memory cell 14. For example, if the $H_1$ and $H_2$ fields are such that the field $H_W$ has a magnitude equal to the field $H_S$, then the $H_1$ and $H_2$ fields each have an x component with a magnitude $H_{HS}$ equal to $H_S/2$, where $H_{HS}$ represents the half-select field. This means that half-selected magnetic memory cells 14 are each subject to a writing field equal to $H_S/2$ along their easy axis during a write operation to magnetic memory cell 14. This is equivalent to a 100 percent half select margin.

In practice, it is preferable that the magnitudes of the $H_1$ and $H_2$ fields be slightly larger than that necessary to create the $H_W$ field in order to provide a write margin. The write margin is required because the switching characteristic represented by line 40 can vary among the magnetic memory cells 14 as a result of variations in the magnetic memory manufacturing process. This results from a variety of factors. There can be manufacturing variation in the crystalline anisotropy value ($H_K$) of the data storage layers of the magnetic memory cells. Furthermore, there can be variations in the thickness of the data storage layers or in the shape of the data storage layers of the magnetic memory cells.

FIG. 5 illustrates the relationship between the $H_1$ field and a reverse field $H_{R1}$ of the data storage layer of a half-selected magnetic memory cell 14. FIG. 5 illustrates one embodiment wherein the preselected angle of orientation of conductors 16 and 18 is 45° with respect to the easy axis. In alternative embodiments, the preselected angle of orientation of conductors 16 and 18 is nonparallel with respect to the easy axis.

Referring back to FIG. 1, in one embodiment a reverse current $I_{R1}$ is being supplied to conductor 18b which intersects or crosses half-selected magnetic memory cell 14c. The reverse current $I_{R1}$ has a polarity which is opposite to the polarity of write current $I_{W2}$ of conductor 18a. In one embodiment, the reverse current $I_{R1}$ has a magnitude which is less than the magnitude of write current $I_{W1}$ in conductor 16a which generates the $H_1$ field in magnetic memory cell 14c. In one embodiment, the reverse current $I_{R1}$ is supplied to conductor 18b at the same time as the write current $I_{W1}$ is supplied to conductor 16a.

The reverse current $I_{R1}$ supplied to conductor 18b causes a reverse magnetic field $H_{R1}$ in magnetic memory cell 14c according to the right-hand rule. In the embodiment illustrated in FIG. 5, vector $H_1$ forms a 45° angle with respect to the x axis as indicated at $\theta_1$. Similarly, vector $H_{R1}$ forms a 45° angle with respect to the x axis as indicated at $\theta_{R1}$. In alternative embodiments, $\theta_1$ and $\theta_{R1}$ are any angle other than a 90° angle with respect to the easy axis when the preselected angle of orientation of conductors 16 and 18 is nonparallel with respect to the easy axis.

In the illustrated embodiment, the magnitude of the $H_{R1}$ field is applied to be one-half of the magnitude of the $H_1$ field. The magnitude of the $H_{R1}$ field is less than the magnitude of the $H_1$ field to avoid significant half-select fields in other magnetic memory cells intersected or crossed by conductor 18b. FIG. 1 illustrates an embodiment where reverse current $I_{R1}$ causes the $H_{R1}$ field in magnetic memory cell 14d which is not selected or half-selected. The $H_{R1}$ and $H_1$ fields each have an x component where the magnitude of the x component of the $H_{R1}$ field is one-half of the magnitude of the x component of the $H_1$ field. The combination of the x components of the $H_{R1}$ and $H_1$ fields is the resulting field $H_W$, which has a magnitude of $H_S/4$. Because $H_W$ is less than the half-select field $H_{HS}$ of $H_1$ in the absence of the $H_{R1}$ field, the presence of the $H_{R1}$ field has improved the half-select margin. In the illustrated embodiment, the half-select margin is increased by approximately a factor of four. In other embodiments, the reverse magnetic field $H_{R1}$ is any suitable magnitude which is less than the magnitude of the $H_1$ field.

FIG. 6 illustrates the relationship between the $H_2$ field and a reverse field $H_{R2}$ of the data storage layer for half-selected magnetic memory cell 14. FIG. 6 illustrates one embodiment wherein the preselected angle of orientation of conductors 16 and 18 is 45° with respect to the easy axis. In alternative embodiments, the preselected angle of orientation of conductors 16 and 18 is nonparallel with respect to the easy axis.

Referring back to FIG. 1, in one embodiment, a reverse current $I_{R2}$ is being supplied to conductor 16b which intersects or crosses half-selected magnetic memory cell 14b. The reverse current $I_{R2}$ has a polarity which is opposite to the polarity of write current $I_{W1}$ in of conductor 16a. In one embodiment, the reverse current $I_{R2}$ has a magnitude which is less than the magnitude of write current $I_{W2}$ in conductor 18a which generates the $H_2$ field in magnetic memory cell 14b. In one embodiment, the reverse current $I_{R2}$ is supplied to conductor 16b at the same time as the write current $I_{W2}$ is supplied to conductor 18a.

The reverse current $I_{R2}$ supplied to conductor 16b causes a reverse magnetic field $H_{R2}$ in magnetic memory cell 14b according to the right-hand rule. In the embodiment illustrated in FIG. 6, vector $H_2$ forms a 45° angle with respect to the x axis as indicated at $\theta_2$. Similarly, vector $H_{R2}$ forms a 45° angle with respect to the x axis as indicated at $\theta_{R2}$. In alternative embodiments, $\theta_2$ and $\theta_{R2}$ are any angle other than a 90° angle with respect to the easy axis when the preselected angle of orientation of conductors 16 and 18 is nonparallel with respect to the easy axis.

In the illustrated embodiment, the magnitude of the $H_{R2}$ field is applied to be one-half of the magnitude of the $H_2$ field. The magnitude of the $H_{R2}$ field is less than the magnitude of the $H_2$ field to avoid significant half-select fields in other magnetic memory cells intersected or crossed by conductor 16b. FIG. 1 illustrates an embodiment where reverse current $I_{R2}$ causes the $H_{R2}$ field in memory cell 14d which is not selected or half-selected. The $H_{R2}$ and $H_2$ fields each have an x component where the magnitude of the x component of the $H_{R2}$ field is one-half of the magnitude of the x component of the $H_2$ field. The combination of the x components of the $H_{R2}$ and $H_2$ fields is the resulting field $H_W$, which has a magnitude of $H_S/4$. Because $H_W$ is less than the half-select field $H_{HS}$ of $H_2$ in the absence of the $H_{R2}$ field, the presence of the $H_{R2}$ field has improved the half-select margin. In the illustrated embodiment, the half-select margin is increased by approximately a factor of four. In other embodiments, the reverse magnetic field $H_{R2}$ is any suitable magnitude which is less than the magnitude of the $H_2$ field.

Figure 7:
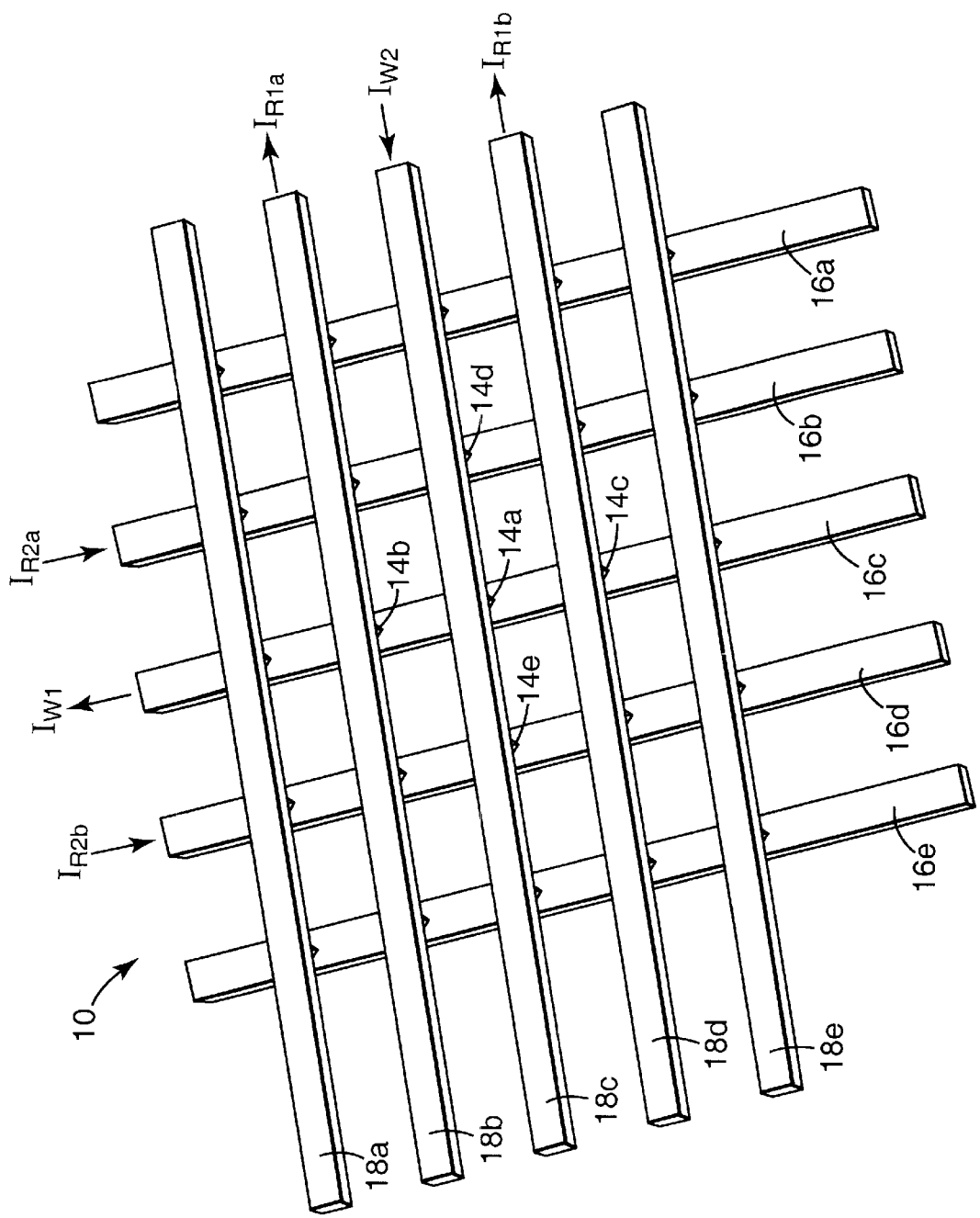
FIG. 7 is a perspective view illustrating one exemplary embodiment of a magnetic memory according to the present invention.

FIG. 7 is a perspective view illustrating one exemplary embodiment of a magnetic memory according to the present invention. Magnetic memory 10 includes an array of magnetic memory cells 14. Magnetic memory 10 also includes conductors 16 and 18 which form an array of word and bit lines which cross magnetic memory cells 14, wherein each magnetic memory cell is intersected by a word and a bit line.

In the illustrated embodiment, a first write current $I_{W1}$ is supplied to conductor 16c and a second write current $I_{W2}$ is supplied to conductor 18c to write magnetic memory cell 14a. In various embodiments, with small manufacturing dimensions, half-selected magnetic memory cells along conductors 16c and 18c which are adjacent to selected magnetic memory cell 14a are affected by the write magnetic fields created along conductors 16c and 18c. In one embodiment, these half-selected magnetic memory cells can have a greater sensitivity to half-select switching than other half-selected magnetic memory cells along conductors 16c and 18c.

In the illustrated embodiment, half-selected magnetic memory cells 14b and 14c along conductor 16c are adjacent to magnetic memory cell 14a and are affected by the write magnetic field created in conductor 18c by write current $I_{W2}$. Half-selected magnetic memory cells 14d and 14e along conductor 18c are adjacent to magnetic memory cell 14a and are affected by the write magnetic field created in conductor 16c by write current $I_{W1}$. Reverse currents $I_{R2a}$ and $I_{R2b}$ are supplied to conductors 16b and 16d respectively, which are adjacent to conductor 16c. Reverse currents $I_{R1a}$ and $I_{R1b}$ are supplied to conductors 18b and 18d, respectively, which are immediately adjacent to conductor 18c. Reverse currents $I_{R1a}$, $I_{R1b}$, $I_{R2a}$ and $I_{R2b}$ improve the half-select margin of magnetic memory cells 14b–14e.

In the illustrated embodiment, reverse currents $I_{R2}$ are not supplied to conductors 16a and 16e because half-selected magnetic memory cells which are located at the intersection of conductor 18c and either conductor 16a or conductor 16e are not adjacent to and in close proximity to magnetic memory cell 14a. Reverse currents $I_{R1}$ are not supplied to conductors 18a and 18e because half-selected magnetic memory cells which are located at the intersection of conductor 16c and either conductor 18a or conductor 18e are not adjacent to and in close proximity to magnetic memory cell 14a.

While in the illustrated embodiment the only conductors supplied the reverse currents $I_{R1}$ or $I_{R2}$ are immediately adjacent to the conductors which are supplied the write currents $I_{W1}$ or $I_{W2}$, it is anticipated that in other embodiments, only conductors on one of the two sides of the conductors which are supplied the write currents $I_{W1}$ or $I_{W2}$ are supplied the reverse currents $I_{R1}$ or $I_{R2}$. Furthermore, it is anticipated that in other embodiments, two or more conductors on one or both sides of the conductors which are supplied the write currents $I_{W1}$ and $I_{W2}$ are supplied the reverse currents $I_{R1}$ or $I_{R2}$. In one embodiment, all conductors other than the conductors which are supplied the write currents $I_{W1}$ or $I_{W2}$ are supplied the reverse currents $I_{R1}$ or $I_{R2}$.

Figure 8:
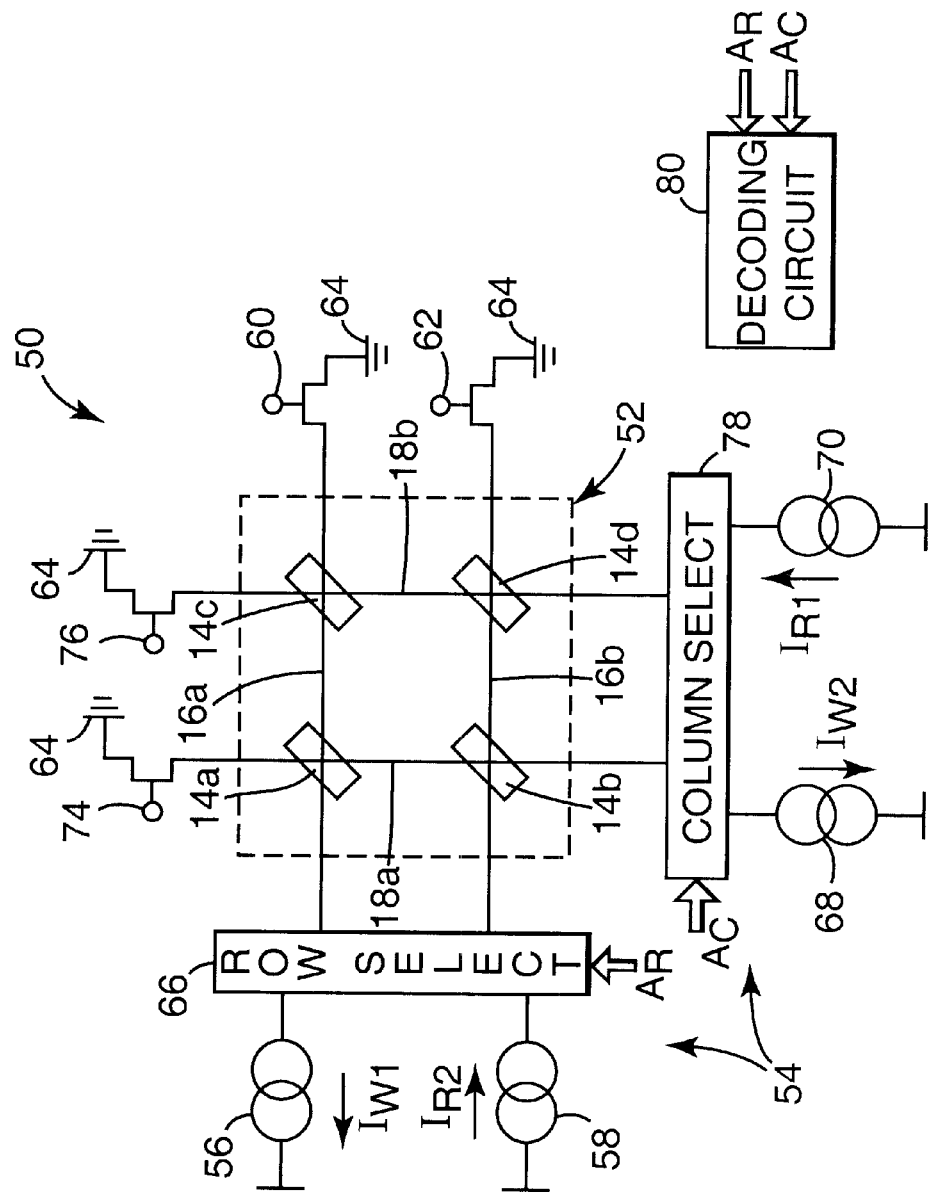
FIG. 8 is a diagram illustrating one exemplary embodiment of a magnetic memory according to the present invention.

FIG. 8 is a diagram illustrating one exemplary embodiment of a magnetic memory according to the present invention. In the embodiment illustrated in FIG. 8, magnetic memory 50 includes an array 52 of magnetic memory cells 14. Although only a relatively small number of magnetic memory cells 14 are illustrated to simplify the description of the invention, in practice, much larger arrays can be used.

In the illustrated embodiment, conductors 16 are word lines and conductors 18 are bit lines which intersect corresponding magnetic memory cells 14. Conductors 16 and 18 and magnetic memory cells 14 have the physical relationship illustrated in the embodiment of FIG. 1.

In the embodiment in FIG. 8, magnetic memory 50 includes a write circuit 54 for supplying write currents and reverse currents to word lines 16 and bit lines 18 during a write operation. Write circuit 54 includes a word line current source at 56 for supplying current $I_{W1}$, and a reverse word line current source at 58 for supplying current $I_{R2}$, wherein the polarity of current $I_{W1}$ is opposite that of current $I_{R2}$. Write circuit 54 includes row select transistors 60 and 62 coupled between word lines 16a and 16b, respectively, and ground 64. Write circuit 54 includes a row select decoder 66 coupled between word lines 16 and word line current source 56 and reverse word line current source 58. In other embodiments, one current source can be used to supply currents $I_{W1}$ and $I_{R2}$, or two or more current sources can be used to supply currents $I_{W1}$ or $I_{R2}$.

In the illustrated embodiment, write circuit 54 includes a bit line current source 68 for supplying current $I_{W2}$, and a reverse bit line current source 70 for supplying current $I_{R1}$, wherein the polarity of current $I_{W2}$ is opposite that of current $I_{R1}$. Write circuit 54 includes column select transistors 74 and 76 coupled between bit lines 18a and 18b, respectively, and ground 64. Write circuit 54 includes a column select decoder 78 coupled between bit lines 18 and bit line current source 68 and reverse bit line current source 70. In other embodiments, one current source can be used to supply currents $I_{W2}$ and $I_{R1}$, or two or more current sources can be used to supply currents $I_{W2}$ or $I_{R12}$.

In the illustrated embodiment, decoding circuit 80 decodes row address $A_R$ and selects row select transistors 60 or 62. Decoding circuit 80 further decodes a column address $A_C$ and selects column select transistors 74 or 76.

In one example embodiment, magnetic memory cell 14a is selected and row select decoder 66 decodes the row address $A_R$ and couples the word line current source 56 to word line 16a which crosses the selected magnetic memory cell 14a. The electrical current $I_{W1}$ in word line 16a creates the first magnetic field $H_1$ in magnetic memory cell 14a as illustrated in the embodiment of FIG. 1. The electrical current $I_{W1}$ in word line 14a also creates the $H_1$ field in half-selected magnetic memory cell 14c. Column select decoder 78 decodes the column address $A_C$ and couples the bit line current source 68 to bit line 18a which crosses the selected magnetic memory cell 14a. The electrical current $I_{W2}$ in bit line 18a creates the second magnetic field $H_2$ in magnetic memory cell 14a, as illustrated in the embodiment of FIG. 1. The electrical current $I_{W2}$ in bit line 20 also creates the $H_2$ field in half-selected magnetic memory cell 14b.

In the example embodiment, row select decoder 66 also couples the reverse word line current source 58 to word line 16b crossing magnetic memory cells 14b and 14d. The electrical current $I_{R2}$ in word line 16b creates the $H_{R2}$ magnetic field in half-selected magnetic memory cell 14b as illustrated in the embodiment of FIG. 1. The electrical current $I_{R2}$ in word line 16b also creates the $H_{R2}$ magnetic field in magnetic memory cell 14d. Column select decoder 78 couples the reverse bit line current source 70 to bit line 18b crossing magnetic memory cells 14c and 14d. The electrical current $I_{R1}$ in bit line 18b causes the $H_{R1}$ magnetic field in half-selected magnetic memory cell 14c as illustrated in the embodiment of FIG. 1. The electrical current $I_{R1}$ in bit line 18b also causes the $H_{R1}$ magnetic field in magnetic memory cell 14d.

In the example embodiment, the reverse magnetic fields $H_{R1}$ and $H_{R2}$ suppress half-selected magnetic memory cell 14c along the bit line 18b and half-selected magnetic memory cell 14b along the word line 16b from being inadvertently switched (see also, FIGS. 5 and 6). In one embodiment, reverse magnetic fields $H_{R1}$ and $H_{R2}$ have a combined resulting field which is less than the field needed to write magnetic memory cell 14d.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory comprising:
    a circuit configured to apply a reverse magnetic field to one or more half-selected magnetic memory cells to improve a half-select margin in the magnetic memory; and
    an array of conductors, wherein a write current supplied to a pair of conductors creates either a first magnetic field or a second magnetic field in the half-selected magnetic memory cells which are not intersected by the pair of conductors, wherein the circuit supplies a reverse current to the one or more half-selected magnetic memory cells which are not intersected by the pair of conductors to create the reverse magnetic field,
    wherein a reverse magnetic field component along an easy axis of the one or more half-selected magnetic memory cells is opposite in direction to the component along the easy axis of either the first magnetic field or the second magnetic field,
    wherein the reverse magnetic field component along the easy axis is less than the component along the easy axis of either the first magnetic field or the second magnetic field.

2. The magnetic memory of claim 1, wherein the angle of orientation of the array of conductors is nonparallel with respect to the easy axis.

3. A magnetic memory comprising:
    an array of magnetic memory cells each including a data storage layer having an easy axis;
    an array of word and bit lines crossing the magnetic memory cells, each magnetic memory cell being intersected by a word line and a bit line; and
    a circuit coupled to the array of word and bit lines configured to apply a reverse magnetic field to one or more half-selected magnetic memory cells to improve the half-select margin in the magnetic memory,
    wherein a write current supplied to one or more word and bit-lines creates either the first magnetic field or the second magnetic field in the half-selected magnetic memory cells which are intersected by either the one or more word lines or the one or more bit lines,
    wherein the circuit supplies a current to one or more half-selected magnetic memory cells which are intersected by either the one or more word lines or the one or more bit lines to create the reverse magnetic field,
    wherein a reverse magnetic field component along the easy axis of the one or more half-selected magnetic memory cells is opposite in direction to the component along the easy axis of either the first magnetic field or the second magnetic field,
    wherein the reverse magnetic field component along the easy axis is less than the component along the easy axis of either the first magnetic field or the second magnetic field.

4. The magnetic memory of claim 3, wherein the angle of orientation of the array of word and bit lines is nonparallel with respect to the easy axis.

5. A magnetic memory comprising:
    an array of memory cells;
    an array of first conductors extending in a first direction which intersect the array of memory cells;
    an array of second conductors extending in a second direction which intersect the array of memory cells; and
    write circuitry coupled to the first conductors and the second conductors, the write circuitry providing a first write current and a second write current respectively to a first conductor and a second conductor crossing a selected memory cell, wherein the write circuitry provides first reverse currents or second reverse currents respectively to one or more first conductors and one or more second conductors crossing half-selected memory cells, wherein the first write current and the first reverse currents have opposite polarity, and wherein the second write current and the second reverse currents have opposite polarity.

6. The magnetic memory of claim 5, wherein the first reverse currents and the second reverse currents are supplied at the same time as the first write current and the second write current.

7. The magnetic memory of claim 6, wherein the first reverse current is less than the first write current and the second reverse current is less than the second write current.

8. The magnetic memory of claim 7, wherein the angle of orientation of the array of first and second conductors is nonparallel with respect to the easy axis.

9. A method for improving the half-select margin in a magnetic memory, the method comprising:

applying a reverse magnetic field to one or more half-selected magnetic memory cells to improve the half-select margin in the magnetic memory;

providing an array of conductors; and supplying a write current to a pair of conductors to create either a first magnetic field or a second magnetic field in the half-selected magnetic memory cells which are not intersected by the pair of conductors; and supplying a reverse current to the one or more half-selected magnetic memory cells which are not intersected by the pair of conductors to create the reverse magnetic field, wherein a reverse magnetic field component along an easy axis of the one or more half-selected magnetic memory cells is opposite in direction to the component along the easy axis of either the first magnetic field or the second magnetic field, wherein the reverse magnetic field component along the easy axis is less than the component along the easy axis of either the first magnetic field or the second magnetic field.

10. The magnetic memory of claim 9, wherein the angle of orientation of the array of conductors is nonparallel with respect to the easy axis.

* * * * *